US010180468B2

(12) United States Patent
Schaller et al.

(10) Patent No.: US 10,180,468 B2
(45) Date of Patent: Jan. 15, 2019

(54) CHIP PACKAGE, A CHIP PACKAGE SYSTEM, A METHOD OF MANUFACTURING A CHIP PACKAGE, AND A METHOD OF OPERATING A CHIP PACKAGE

(71) Applicant: Infineon Technologies AG, Neubiberg (DE)

(72) Inventors: Rainer Markus Schaller, Donau (DE); Goran Keser, Munich (DE); Manuel Harrant, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 83 days.

(21) Appl. No.: 15/176,240

(22) Filed: Jun. 8, 2016

(65) Prior Publication Data

US 2017/0356968 A1 Dec. 14, 2017

(51) Int. Cl.
*G01R 33/07* (2006.01)
*G01R 33/09* (2006.01)
*H01L 25/04* (2014.01)
*H01L 43/02* (2006.01)
*H01L 43/04* (2006.01)
*H01L 43/06* (2006.01)
*H01L 43/08* (2006.01)
*H01L 43/12* (2006.01)

(52) U.S. Cl.
CPC .............. *G01R 33/07* (2013.01); *G01R 33/09* (2013.01); *H01L 25/04* (2013.01); *H01L 43/02* (2013.01); *H01L 43/04* (2013.01); *H01L 43/06* (2013.01); *H01L 43/08* (2013.01); *H01L 43/12* (2013.01)

(58) Field of Classification Search
CPC .. B64G 1/366; G01R 33/0206; G01R 33/028; G01R 33/038; G01R 33/1215; G01R 33/07; G01R 33/09; H01L 43/06; H01L 25/04; H01L 43/12; H01L 43/08; H01L 43/04; H01L 43/02
USPC .................................................. 324/244, 251
See application file for complete search history.

(56) References Cited

U.S. PATENT DOCUMENTS

| 4,589,282 A * | 5/1986 | Dumery | G01F 23/72 324/204 |
| 2004/0150385 A1* | 8/2004 | Schroeder | G01R 33/07 324/117 R |
| 2004/0189292 A1* | 9/2004 | Kautz | G01R 33/02 324/244 |
| 2009/0212770 A1* | 8/2009 | Koyama | G01R 33/09 324/249 |

(Continued)

*Primary Examiner* — Tung X Nguyen
*Assistant Examiner* — Robert P Alejnikov, Jr.
(74) *Attorney, Agent, or Firm* — Viering, Jentschura & Partner MBB

(57) ABSTRACT

A chip package, a chip package system, a method of manufacturing a chip package, and a method of operating a chip package including: a first sensor configured to measure a magnetic field component up to a maximum magnetic field value; a second sensor configured to measure the magnetic field component beyond the maximum magnetic field value; and a circuit coupled to the first sensor and the second sensor and configured to receive at least one sensor signal from at least one of the first sensor and the second sensor, wherein the circuit is further configured to select the first sensor or the second sensor to measure the magnetic field component based on the received sensor signal.

20 Claims, 8 Drawing Sheets

(56) References Cited

U.S. PATENT DOCUMENTS

2014/0236514 A1* 8/2014 Icove .................... G01V 3/081
702/65
2015/0177286 A1* 6/2015 Fuji ................... G01R 33/0005
324/144
2016/0025529 A1* 1/2016 Astegher ............ G01L 19/0092
73/1.15

* cited by examiner

CHIP PACKAGE, A CHIP PACKAGE SYSTEM, A METHOD OF MANUFACTURING A CHIP PACKAGE, AND A METHOD OF OPERATING A CHIP PACKAGE

TECHNICAL FIELD

Various embodiments relate generally to a chip package, a chip package system, a method of manufacturing a chip package, and a method of operating a chip package.

BACKGROUND

Magnetic field sensors have many practical uses. Developments in semiconductor based sensors, e.g., a magnetic field-based current sensor containing Hall sensors or magnetoresistive elements (MREs), allow multiple sensors to be compactly packaged in one chip package. Accordingly, a single, compact package may contain a plurality of sensors configured for various value ranges of a magnetic field, thus expanding the dynamic range a chip package may cover, i.e., beyond a maximum value of a single sensor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
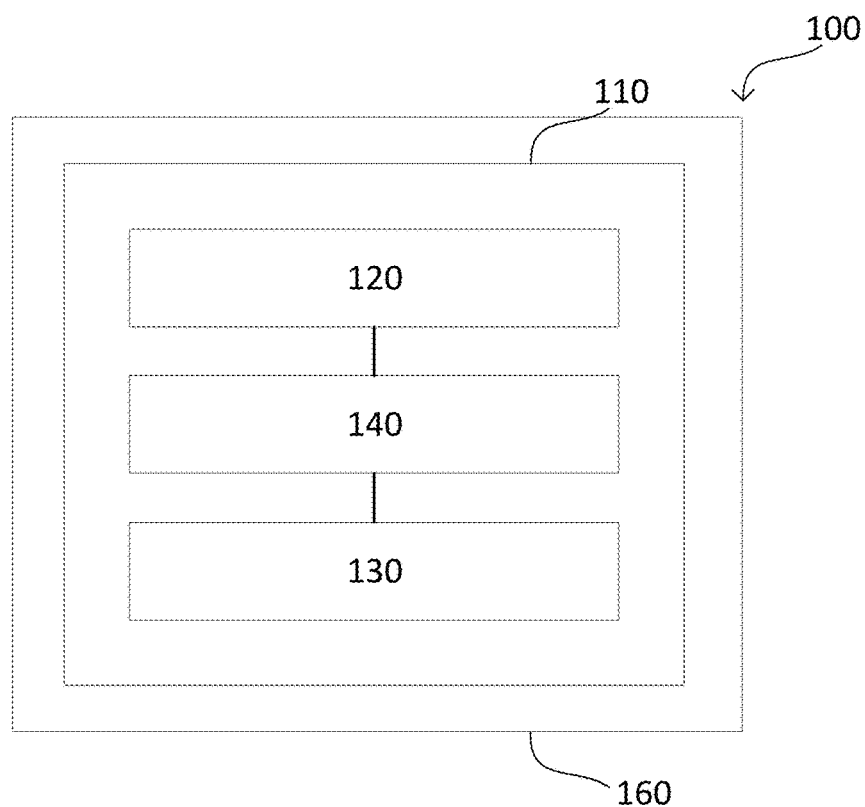
FIG. 1 shows a block diagram of a chip package.

The following detailed description refers to the accompanying drawings that show, by way of illustration, specific details and embodiments in which the invention may be practiced.

The word exemplary is used herein to mean serving as an example, instance, or illustration. Any embodiment or design described herein as exemplary is not necessarily to be construed as preferred or advantageous over other embodiments or designs.

As used herein, an electrically conductive material may include or may be formed from: a metal, a metal alloy, an intermetallic compound, a silicide (e.g., titanium silicide, molybdenum silicide, tantalum silicide, or tungsten silicide), a conductive polymer, a polycrystalline semiconductor, or a highly doped semiconductor, e.g., polycrystalline silicon (which may also be referred to as polysilicon), or a highly doped silicon. An electrically conductive material may be understood as material with moderate electrical conductivity, e.g., with an electrical conductivity (measured at room temperature and constant electric field direction) greater than about 10 S/m, e.g., greater than about $10^2$ S/m, or with high electrical conductivity, e.g., greater than about $10^4$ S/m, e.g., greater than about $10^6$ S/m.

A metal, as used herein, may include or may be formed from one element of the following group of elements: aluminum, copper, nickel, magnesium, chromium, iron, zinc, tin, gold, silver, iridium, platinum, or titanium. Alternatively or additionally, a metal may include or may be formed from a metal alloy including one element or more than one element. For example, a metal alloy may include an intermetallic compound, e.g., an intermetallic compound of gold and aluminum, an intermetallic compound of copper and aluminum, an intermetallic compound of copper and zinc (brass) or an intermetallic compound of copper and tin (bronze).

As used herein, an electrically insulating material, e.g., a dielectric material, may be understood as material with poor electrical conductivity, e.g., with an electrical conductivity (measured at room temperature and constant electric field direction) less than about $10^{-2}$ S/m, e.g., less than about $10^{-5}$ S/m, or, e.g., less than about $10^{-7}$ S/m.

As used herein, an electrically insulating material may include a semiconductor oxide, a metal oxide, a ceramic, a semiconductor nitride, a metal nitride, a semiconductor carbide, a metal carbide, a glass, e.g., fluorosilicate glass (FSG), a dielectric polymer, a silicate, e.g., hafnium silicate or zirconium silicate, a transition metal oxide, e.g., hafnium dioxide or zirconium dioxide, an oxynitride, e.g., silicon oxynitride, or any other type of dielectric material. An insulating material may withstand an electric field without breaking down (in other words without experiencing failure of its insulating properties, e.g., without substantially changing its electrical conductivity).

As used herein, a circuit may be understood as any kind of logic (analog or digital) implementing entity, which may be special purpose circuitry or a processor executing software stored in a memory, firmware, hardware, or any combination thereof. Furthermore, a circuit may be a hardwired logic circuit or a programmable logic circuit such as a programmable processor, for example a microprocessor (for example a Complex Instruction Set Computer (CISC) processor or a Reduced Instruction Set Computer (RISC) processor). A circuit may also be a processor executing software, for example any kind of computer program, for example a computer program using a virtual machine code such as, for example, Java. Any other kind of implementation of the respective functions which will be described in more detail below may also be understood as a circuit. It is understood that any two (or more) of the described circuits may be combined into a single circuit with substantially equivalent functionality, and, conversely, that any single described circuit may be distributed into two (or more) separate circuits with substantially equivalent functionality. In particular with respect to the use of circuitry in the Claims included herein, the use of circuit may be understood as collectively referring to two or more circuits. In addition, the circuit may be located within a chip package or external to the chip package. If the circuit is external to the chip package, it may be electrically coupled to internal components of the chip package, e.g., a sensor element or a sensor element strip.

A circuit as used herein, may implement logic or receive an electrical signal. A circuit may thus refer to any analog or digital circuitry that may receive an electrical signal and which may output an electrical signal, which may include analog data, digital data, or a combination thereof. A circuit may thus refer to an analog circuit, digital circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Accordingly, a circuit may perform processing on an electrical or optical signal as hardware or as software, such as software executed on hardware (e.g., a processor or microprocessor). As utilized herein, digital circuit may refer to a circuit implemented using digital logic that performs processing on a signal, e.g., an electrical or optical signal, which may include logic circuit(s), processor(s), scalar processor(s), vector processor(s), microprocessor(s), controller(s), microcontroller(s), Central Processing Unit(s) (CPU), Graphics Processing Unit(s) (GPU), Digital Signal Processor(s) (DSP), Field Programmable Gate Array(s) (FPGA), integrated circuit(s), Application Specific Integrated Circuit(s) (ASIC), or any combination thereof. Furthermore, it is understood that a single circuit may be equivalently split into two separate circuits, and conversely that two separate circuits may be combined into a single equivalent circuit.

As used herein, memory may be understood as an electrical component in which data or information can be stored for retrieval. References to memory included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as memory or a memory may be composed of more than one different type of memory, and thus may refer to a collective component including one or more types of memory. It is readily understood that any single memory component may be separate, multiple collectively equivalent memory components, and vice versa. Furthermore, it is appreciated that while memory may be depicted, such as in the drawings, as separate from one or more other components, it is understood that memory may be integrated within another component, such as on a common integrated chip.

As used herein, a sensor may refer to a magnetic sensor. The sensor may be a transducer that may output a signal in response to a magnetic field input, such as a magnetic field due to moving charges. For example, the sensor may be a Hall effect sensor or a magnetoresistive element sensor. A magnetoresistive element (MRE), as used herein, may refer to a sensor containing a material (e.g., in the form of a sensor element strip) that varies electrical resistance in the presence of magnetization of an applied external magnetic field.

According to various embodiments, a sensor may be formed as part of, or may include, a die (such as a semiconductor die). For example, the die may include the sensor. In other words, the sensor may be implemented into (e.g., may be part of) a die, e.g., monolithically integrated. The die (which may also be referred to as a chip, semiconductor chip, or microchip) may be processed in semiconductor technologies, on a wafer, or in a wafer (or, e.g., a substrate or a carrier). The die may include one or more sensors, which are formed during semiconductor technology processing or fabrication. The carrier may be part of the semiconductor chip, e.g., the semiconductor carrier may be part of, or may form, the semiconductor body of the chip. Optionally, the microelectromechanical component may be part of, or may be electrically coupled to, an integrated circuit on the chip.

According to various embodiments, a carrier (e.g., of a sensor, e.g., the semiconductor carrier of a die) may be singulated from a wafer by removing material from a kerf region of the wafer (also referred to as dicing or cutting the wafer). For example, removing material from the kerf region of the wafer may be processed by scribing and breaking, cleavage, blade dicing, or mechanical sawing (e.g., using a dicing saw). In other words, the carrier may be singulated by a wafer dicing process. According to various embodiments, a carrier may be formed from a lead frame, e.g., a metal lead frame. The carrier may be electrically contacted and encapsulated, e.g., by mold materials, into a chip package, which may be suitable for use in electronic devices. Furthermore, the die (which may be bonded to a carrier) may be mounted (e.g., soldered) onto a printed circuit board.

According to various embodiments, a carrier (e.g., of a sensor or the semiconductor carrier of a die) may be covered with a passivation layer for protecting the carrier from environmental influences, e.g., oxidation. The passivation layer may include a metal oxide, an oxide of a semiconductor carrier (which may also be referred to as a carrier or semiconductor body), e.g., silicon oxide, a nitride, e.g., silicon nitride, a polymer, e.g., benzocyclobutene (BCB) or polyimide (PI), a resin, a resist, or a dielectric material.

As used herein, a chip package may be a combination of components that may include a die, a contact structure electrically contacting a chip, and packaging material at least partially enclosing the die and the contact structure. The contact structure may provide an electrically conductive connection to the chip from outside the packaging material. The metal contact structure may include, for example, a bond wire, which may include or consist of metal.

As used herein, a dynamic range may be a range of values from a minimum detectable value to a maximum detectable value. For example, the dynamic range may be the minimum to maximum magnetic field values a chip package may be configured to, via sensors, effectively measure and output a signal corresponding to the measured magnetic field value, i.e., a range of values where one or more sensors may distinguish between different values, e.g., within a linear range of values.

In the following description, various aspects of a chip package including a sensor arrangement are described. The sensor arrangement may have an expanded dynamic range.

The dynamic range of semiconductor current sensors may be a limiting factor in shunt-systems, as well as in magnetic field-based systems, e.g., Hall sensors and MREs. A relationship between the lowest detectable current value and the end of the measurement scale, i.e., the highest detectable current value, may define the dynamic range of a system.

Applications such as indicating a battery charge state in a battery management system, e.g., electric automobiles, may require an expansive dynamic range, for example, the dynamic range may span a dynamic range minimum to maximum relationship of 1 to more than 1,000. In such an application, both high currents during automobile operation and the smallest leakage currents in a standby mode, e.g., when an electric automobile is parked, must be determined, as these scenarios are constantly changing the charge state of the battery.

To be able to cover such a wide dynamic range, multiple sensors may be utilized in a chip package, e.g., in a dual die package that may house chips with magnetically sensitive elements. The various sensors may be configured to detect different value ranges, respectively, thus allowing a chip package to have an expanded dynamic range. This may be implemented in various embodiments.

FIG. 1 shows a block diagram of a chip package 100. Chip package 100 may be a magnetic field sensor with an extended measurement range. Chip package 100 may measure a magnetic field component, for example, of a current, i.e., flow of electric charge. Chip package 100 may include a first sensor 120 configured to measure a magnetic field component up to a maximum magnetic value; a second sensor 130 configured to measure the magnetic field component beyond the maximum magnetic field value; and a circuit 140 coupled to the first sensor 120 and the second sensor 130. The circuit 140 may be configured to receive at least one sensor signal from at least one of the first sensor and the second sensor, wherein the circuit 140 is further configured to select the first sensor 120 or the second sensor 130 to measure the magnetic field component based on the received sensor signal. Put another way, an internal logic may switch between measurement ranges, i.e., select between the chips containing magnetic field sensors, based on a pre-programmed magnetic field value, e.g., at a value near a maximum of the lower measurement range.

First sensor 120 may provide a first signal corresponding to a magnitude of a magnetic field component in a first value range up to the maximum magnetic field value and the second sensor 130 may provide a second signal corresponding to the magnitude of the magnetic field within a second value range beyond the magnetic field value of the first value range. Thus, a dynamic range of the chip package may be increased beyond the maximum magnetic field value of the first value range, i.e., as second sensor 130 may measure magnetic field component values beyond the maximum measurable value of first sensor 120, the overall dynamic range of chip package 100 may be increased.

Additionally or alternatively, the first value range and the second value range may at least partially overlap so that first sensor 120 and second sensor 130 may be able to measure magnetic field values within a common range of values. For example, second sensor 130 may be able to measure a greater magnetic field value than first sensor 120, while first sensor 120 may be able to measure a lesser magnetic field value than second sensor 130, and both first sensor 120 and second sensor 130 may have a common range of values that overlap in which both sensors are able to measure the magnetic field value. Within this common range of magnetic field values, chip package 100 may be able to provide a redundant measurement of the magnetic field value.

First sensor 120, second sensor 130, and circuit 140, may be arranged on a carrier 110. Carrier 110 may be formed from a non-magnetic material. Carrier 110 may be a lead frame formed from a non-magnetic metal or metal alloy.

At least one of first sensor 120 and second sensor 130 may be configured to measure the magnetic field component parallel to the first sensor 120 or second sensor 130, e.g., if the sensor includes a magnetoresistive element. For example, both first sensor 120 and second sensor 130 may be configured to measure a magnetic field component parallel with both sensors. Alternatively, only one of first sensor 120 and second sensor 130 may measure a magnetic field component parallel with the respective sensor.

Additionally or alternatively, at least one of first sensor 120 and second sensor 130 may be configured to measure the magnetic field component perpendicular to the first sensor 120 or second sensor 130, e.g., if the sensor includes a Hall effect sensor. For example, both first sensor 120 and second sensor 140 may be configured to measure a magnetic field component perpendicular to both sensors. Alternatively, only one of first sensor 120 and second sensor 130 may measure a magnetic field component perpendicular to the respective sensor.

Chip package 100 may include encapsulant 160, e.g., a mold material, which may include a resin, encapsulating the first sensor 120, second sensor 130, and circuit 140. Chip package 100 may also include contact terminals (not shown here), e.g., contact pads or pins. The respective terminals may include a plurality of pins to independently contact first sensor 120 and second sensor 130. In addition, the contact terminals may include an independent power supply connection for first sensor 120, as well as second sensor 130, as well as an independent contact for the output of a sensor signal. The terminals and/or power supplies may be physically separated from carrier 110 and electrically connected to carrier 110 via an electrically conductive element, for example, a bonding wire.

Chip package 100 may be implemented in various forms to obtain an expanded dynamic range. In the following description, various forms may be described that are combinable in different ways. One aspect may include an arrangement where a conductor for receiving a target current (e.g., a current to be measured) may be routed internally through the chip package. In another aspect, the target current may be in a conductor external to the chip package and the chip package may be arranged proximate to a structure in which the target current runs.

Figure 2A:
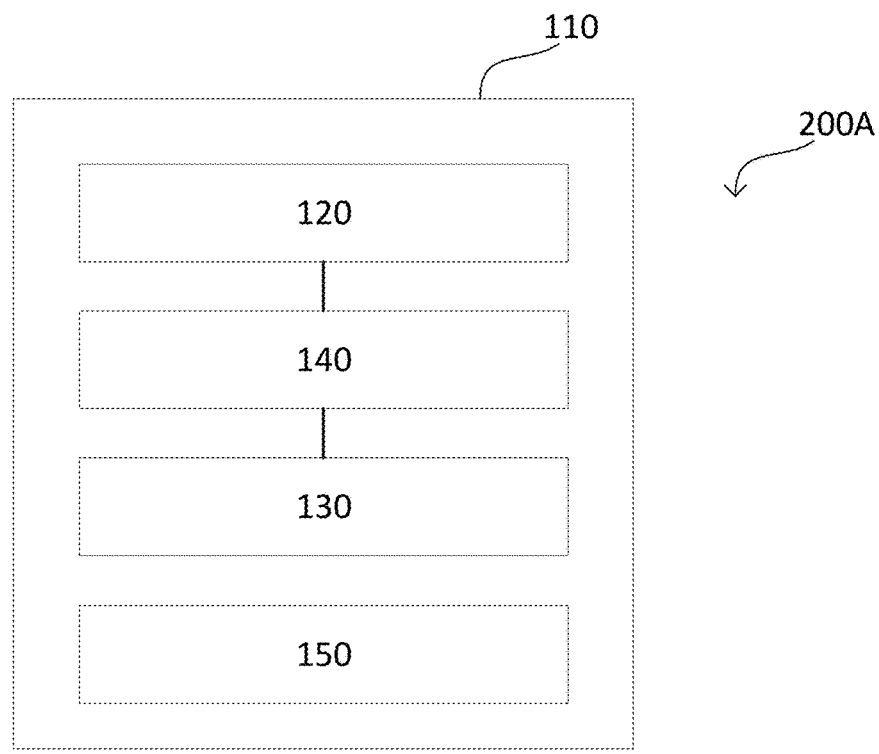
FIGS. 2A & 2B show chip package systems.

FIG. 2A shows chip package system 200A. Chip package system 200A may include a structure internal to the chip package through which a target current may run. The structure may be an electrically conductive element 150, which may be formed from metal. Electrically conductive element 150 may include a plurality of electrical contacts for electrically contacting electrically conductive element 150. Electrically conductive element 150 may be galvanically isolated from first sensor 120 and second sensor 130 (i.e., there may be no direct conduction path from current source 150 to either first sensor 120 or second sensor 130). Electrically conductive element 150 may be integral with carrier 110.

Alternatively, carrier 110 may be formed from an electrically conductive material, e.g., metal. An additional electrically conductive element 150 may be optional. Carrier 110 may include a plurality of electrical contacts for electrically contacting electrically conductive element 150, so that a target current may run through carrier 110. Carrier 110 may be galvanically isolated from first sensor 120 and second sensor 130.

Figure 2B:
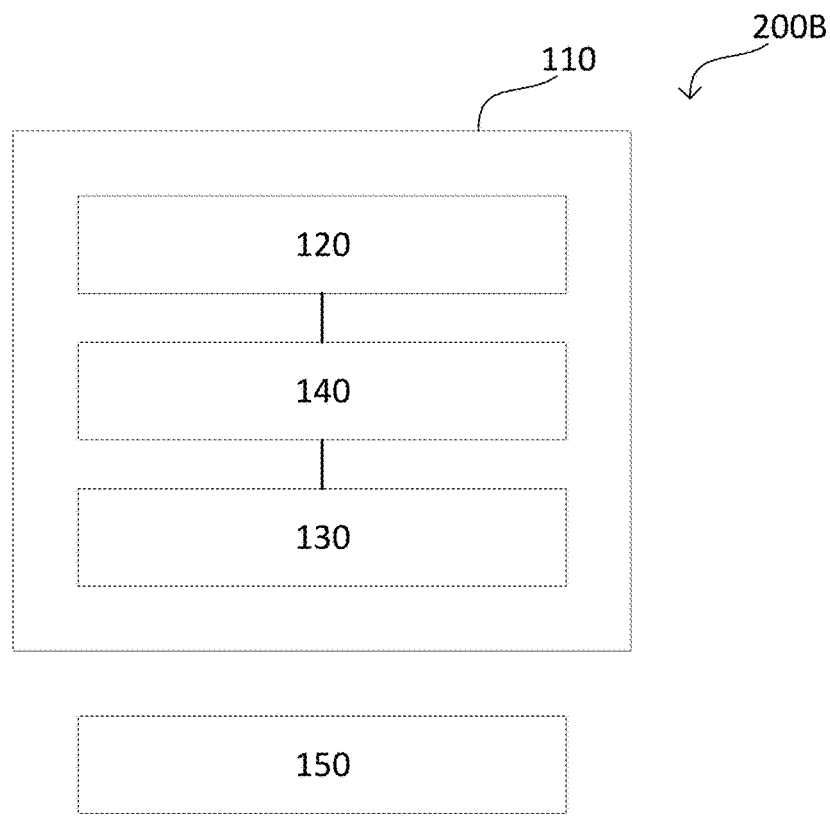

FIG. 2B shows chip package system 200B. In chip package system 200B, a target current may run through an electrically conductive element 150 that is external to the chip package, e.g., chip package 100. The chip package may be arranged proximate to the electrically conductive element 150. The electrically conductive element 150 may, for example be formed from metal.

Electrically conductive element 150 may be formed in or on a substrate. For example, electrically conductive element 150 may be a current rail within a printed circuit board (PCB). The current rail may be structured, i.e., have a desired form, e.g., a geometric shape. The chip package may be mounted on the substrate.

As discussed above, a chip package, e.g., chip package 100, may include an electrically conductive element 150 that is either internal or external to the chip package, and through which, a target current may run. In further aspects of the disclosure, the arrangement of first sensor 120 and second sensor 130 will be discussed. Any of the following arrangements may be combined with an internal or external arrangement of an electrically conductive element 150.

Figure 3A:
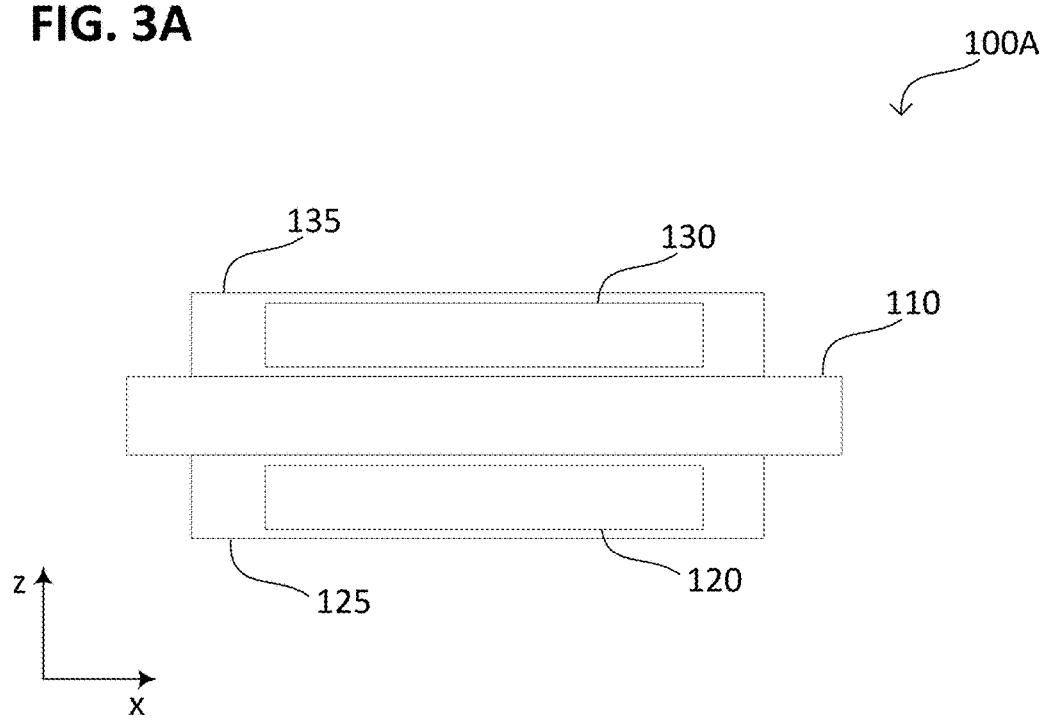
FIG. 3A-3E show respective arrangements of a die or dies containing sensors in a chip package.

FIG. 3A shows chip package 100A, which may be similar to chip package 100. In chip package 100A, first sensor 120 may be in a first die 125 and second sensor 130 may be in a second die 135. First die 125 and second die 135 may be on opposite surfaces of carrier 110.

Figure 3B:
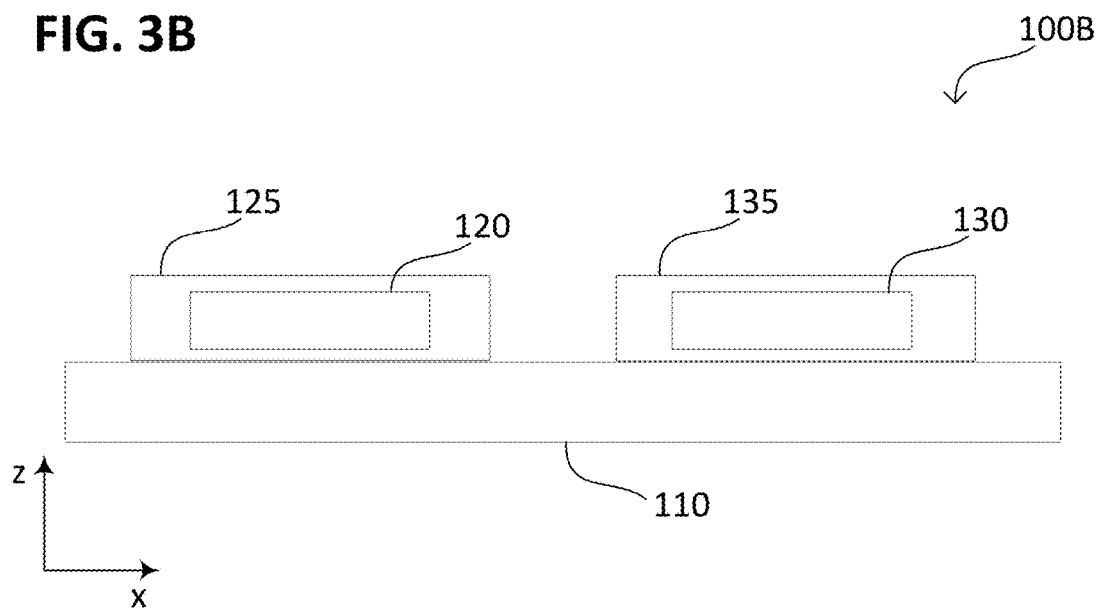

FIG. 3B shows chip package 100B, which may be similar to chip package 100. First sensor 120 may be in a first die 125 and second sensor 130 may be in a second die 135. However, in comparison to chip package 100A, first die 125 and second die 135 may be on the same surface of carrier 110. First die 125 may be laterally adjacent to second die 135 on the same surface of carrier 110.

Figure 3C:
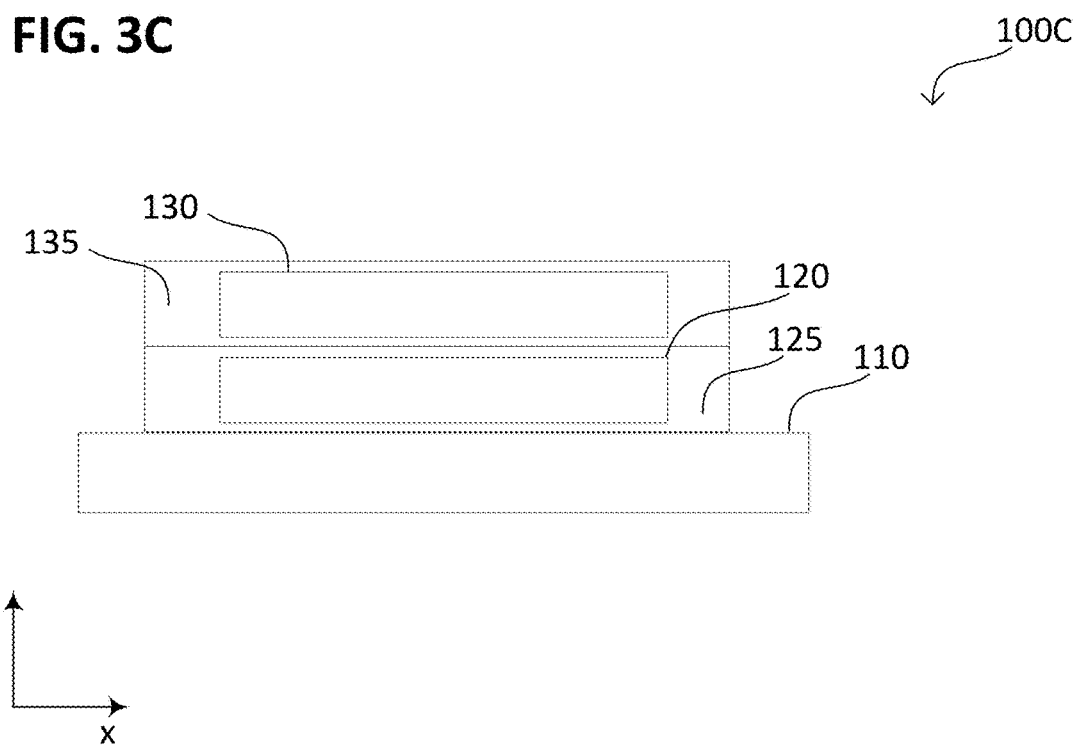

FIG. 3C shows chip package 100C, which may be similar to chip package 100. First sensor 120 may be in a first die 125 and second sensor 130 may be in a second die 135. Similarly to chip package 100B, first die 125 and second die 135 may be on the same side of a surface of carrier 110. However, first die 125 may be subjacent to second die 135, i.e., below. In other words, second die 135 may be stacked on first die 125, or vice versa.

Figure 3D:
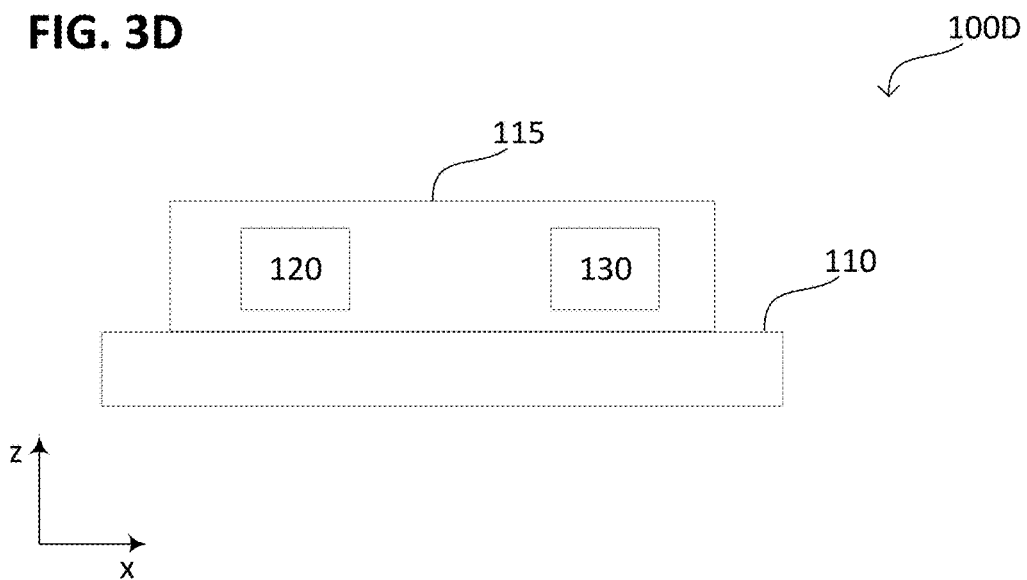

FIG. 3D shows chip package 100D, which may be similar to chip package 100. Both first sensor 120 and second sensor 130 may be in a single die 115, which may be on a surface of carrier 110.

Figure 3E:
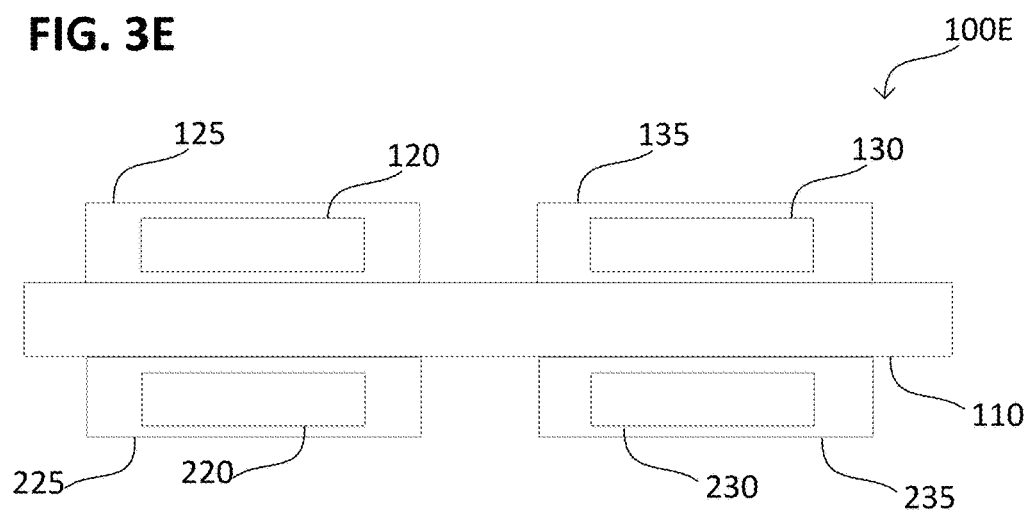

FIG. 3E shows chip package 100E, which may contain a plurality of dies containing sensors configured to measure a magnetic field component. Although four sensors may be depicted in chip package 100E, any number of sensors may be implemented to achieve additional levels of dynamic range extension or increased redundancy.

For example, third sensor 220 may be configured to measure the same range of values as first sensor 120 and fourth sensor 230 may be configured to measure the same range of values as second sensor 130. This arrangement may increase redundancy of chip package 100E beyond redundancy levels of a dual sensor chip package. This redundancy may increase functional safety of a chip package. Functional safety may be an important goal for various electronic standards focused on safety. For example, in an automotive context, ISO 26262 (from the International Organization for Standardization), may define standards for electronics in automotive applications.

In another aspect of the disclosure, first sensor 120, second sensor 130, third sensor 220, and fourth sensor 230, may be configured to measure consecutively increasing value ranges of the magnetic field component, e.g., with each sensor having an increasing maximum magnetic field value.

As may be illustrated in FIG. 3E, first die 125 and second die 135 may be on the same surface of carrier 110. First die 125 may include first sensor 120 and second die 135 may include second sensor 130. On the opposite surface of carrier 110, a third die 225 including a third sensor 220 and a fourth die 235 including a fourth sensor 230 may be arranged. Additionally or alternatively, the plurality of dies containing sensors may be arranged a stacked manner, be formed within a single die, etc., as discussed above. Chip package 100E is merely an example of an arrangement of a plurality of sensors in the chip package, and may be arranged in various ways also illustrated in chip packages 100A-100E.

Various aspects of the disclosure including location of an electrically conductive element for a target current and sensor arrangement were discussed above. These aspects may be combined in various embodiments. In the following, various aspects related to the sensors themselves will be discussed. The following aspects may allow for further tuning to extend the dynamic range of a chip package. These aspects may be combined with those aspects discussed above.

In an aspect of the disclosure, the dynamic range may be extended by arranging magnetic sensors at differing distances (e.g., along a z-axis) from a magnetic field source, e.g., a target current. Thus, first sensor 120 may arranged a first distance from the target current and second sensor 130 may be arranged a second distance from the target current. For example, the first distance may be less than the second distance, or vice versa, depending on the arrangement of the magnetic field source, e.g., a target current.

Accordingly, if first sensor 120 is closer to the target current, it may measure a greater value of the magnetic field component in comparison to second sensor 130, which may be farther from the target current. Thus, knowing the first distance and the second distance may allow a relationship between first sensor 120 and second sensor 130 to be determined, and thus a measured value of the magnetic field component from each sensor may be obtained. As second sensor 130 may be further from the current source than first sensor 120, for example, the magnetic field component at the second sensor 130 may be within a measurable range of second sensor 130, but not within a measurable range of first sensor 120, e.g., within a resolution of second sensor 130 or between saturation values of second sensor 130, and a magnetic field value may be measured by chip package 100 which then represents the current of the target current.

In other words, the strength, i.e., the magnitude, of a magnetic field originating from a current that is to be measured in a conductor, e.g., an electrically conductive element 150, decreases with increasing distance from the conductor. For example, for a long wire with a circular cross-section, the magnetic field, B, is roughly proportional to $$\frac{1}{r},$$

where r is the distance to the surface of the conductor. Arranging dies containing sensors at different distances to the current-carrying conductor may allow each sensor to measure different values of a component of the magnetic field. Therefore, the greater the difference of value of the component of the magnetic field (e.g., the magnitude) at each sensor, the greater the dynamic range may be extended.

As an example, at two respective distances, arbitrarily designated position one and position two, any desirable relationship (n:1, where n may be a real number greater than 0) may be realized between the magnitude of the magnetic field at a sensor at position one and the magnitude of the magnetic field at a sensor at position two. For example, a relationship of greater than 10:1 may be possible, which would extend the dynamic range by an order of ten. Principally, however, any relationship between the measured magnetic field component at position one and position two may be achieved.

Figure 4A:
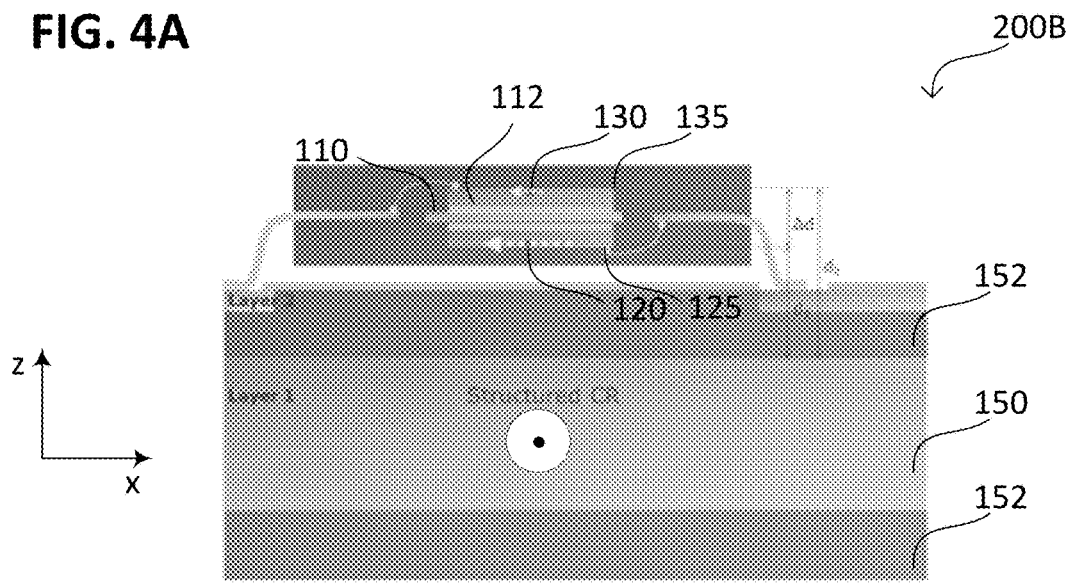
FIG. 4A-4C show respective aspects of sensor tuning in a chip package.

FIG. 4A shows chip package system 200B, which may be similar to chip package 100, in an exemplary embodiment of first sensor 120 and second sensor 130 at various distances from a magnetic field source. The magnetic field source may be a current flowing through electrically conductive element 150 in a direction along the y-axis (out of the Figure). FIG. 4A is merely an illustration of combinations of various aspects of the disclosure and is not intended to limit the disclosure to a single embodiment.

As shown, chip package system 200B includes a chip package, e.g., chip package 100A, attached to a structure including electrically conductive element 150. As discussed above, first sensor 120 may be arranged a first distance ($d_1$) from electrically conductive element 150 and second sensor 130 may be arranged a second distance ($d_2$) from electrically conductive element 150. Thus, first sensor 120 may be a distance ($\Delta d$) from second sensor 130 within chip package system 200B.

In this example, first distance ($d_1$) may include, e.g., a thickness of dielectric layer 152, which may be pre-impregnated composite fibers (also commonly known as prepreg); any outer conductive layers of the structure, e.g., a copper layer; a passivation layer on the conductive layer, e.g., solder resist; any gap between the structure and chip package; a thickness of encapsulant from an outer surface to an outer surface of first die 125. Second distance ($d_2$) may include, e.g., a first distance ($d_1$); a thickness of first die 125; a thickness of an adhesive material (bond line thickness (BLT)) adhering first die 125 to carrier 110; a thickness of carrier 110; a thickness of an adhesive material 112 (bond line thickness (BLT)) adhering second die 135 to carrier 110; and a thickness of second die 135. Therefore, distance ($\Delta d$), which may be the distance between first sensor 120 and second sensor 130, may include, e.g., a thickness of first die 125, a thickness of second die 135, a thickness of carrier 110, and a thickness of adhesive material for first die 125 and second die 135, e.g., the sum of the respective bond line thicknesses.

Accordingly, as indicated by the arrows passing through first sensor 120 and second sensor 130, a magnetic field value of the magnetic field component passing through each respective sensor may be different, as indicated by the size of the arrow, which corresponds to the amplitude of the magnetic field value, for example, first sensor 120 is closer to current source 150, and the magnetic field value of the magnetic field component is thus greater than the amplitude of the arrow passing through sensor 130.

In another aspect of the disclosure, differing magnetic field sensor technologies may be employed to extend a dynamic range of the chip package, e.g., a first sensor may be more sensitive to a magnetic field in a range of values different from a second sensor. Accordingly, first sensor 120 may have a different magnetic sensor technology than second sensor 130. The magnetic sensor technology may be a Hall sensor or a magnetoresistive element, for example, an anisotropic magnetoresistive element (AMR), a giant magnetoresistive element (GMR), or a tunnelling magnetoresistive element (TMR) (a magnetic tunnel junction element (MJT)), etc.

For example, with reference to FIG. 4A, first sensor 120 may include a TMR element and second sensor 130 may include an AMR element. First sensor 120 may be more sensitive than second sensor 130 and may have a wider linear range in comparison to the AMR element in second sensor 120. Therefore, first sensor 120 may be used for a measurement of the magnetic field component up until a maximum magnetic value, for example, until a range of values where second sensor 130 may have a preferable sensitivity.

Figure 4B:
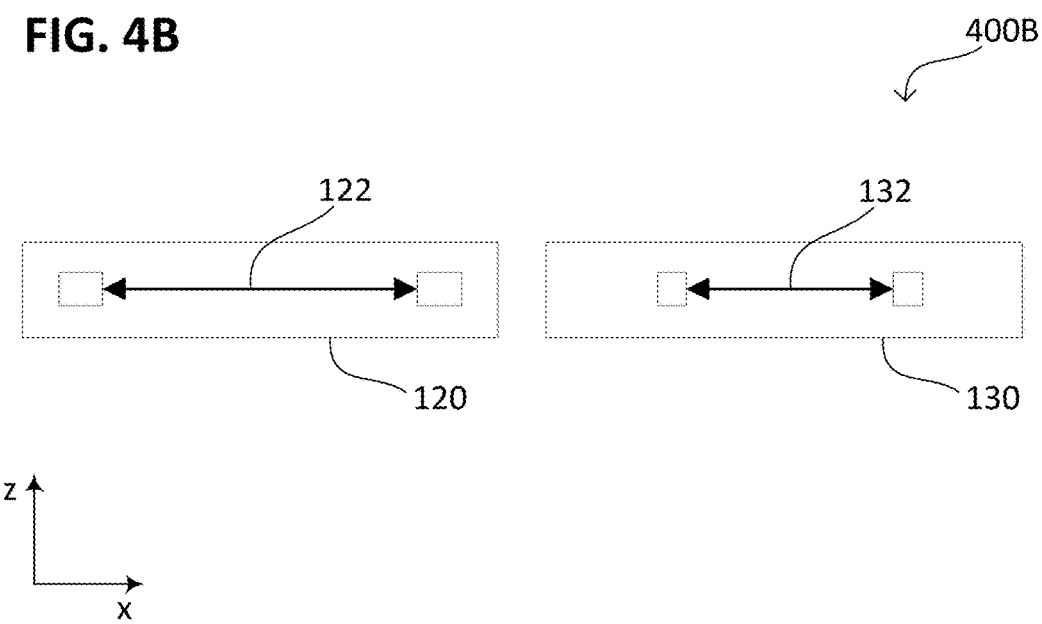

In another aspect of the disclosure, the definition of the working distance (along an x-axis) of at least two sensor element strips of first sensor 120 and at least two sensor element strips of second sensor 130 may be different. By adjusting the working distance, a measured value of a magnetic field passing through the respective sensors may be finely tuned. FIG. 4B shows arrangement 400B with different working distances in first sensor 120 and second sensor 130.

For example, first sensor 120 may include at least two sensor element strips arranged a first distance 122 apart. Second sensor 130 may include at least two sensor element strips arranged a second distance 132 apart. The first distance may be different from the second distance, e.g., the first distance may be greater than the second distance. As an example, the first distance may lie within a range of 0.25 mm to 3.0 mm, e.g., 2.5 mm. The second distance may lie within a range of 0.25 mm to 3.0 mm, e.g., 1.75 mm. First sensor 120 and second sensor 130 may each be arranged as a Wheatstone bridge circuit.

Accordingly, by increasing distance between the sensor element strips, a magnetic field component passing through each element may be greater, which may increase the precision of the sensor, e.g., first sensor 120 or second sensor 130, i.e., a greater working distance, may increase a measured component of a gradient of a magnetic field component.

Figure 4C:
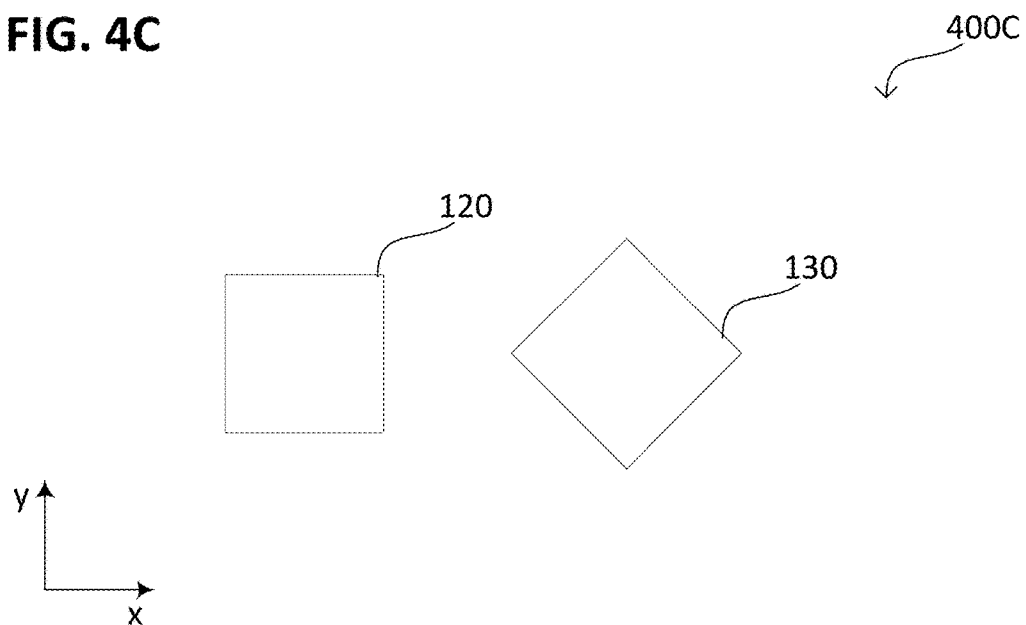

In another aspect of the disclosure, first sensor 120 and second sensor 130 may be in differing rotational positions in the x-y plane with reference to one another, e.g., second sensor may be rotated 45 degrees in relation to first sensor 120. FIG. 4C shows arrangement 400C with rotated sensors. For example, by rotating an AMR sensor in a magnetic field, an angle of the applied magnetic field is changed, and thus a range of values covered by a linear operational range of the sensor may be adjusted.

These aspects may be utilized alone or in any combination to extend the dynamic range of a chip package such as chip package 100. In addition, other known factors, such as die thickness, may additionally be tuned to extend the dynamic range of a chip package.

A chip package, e.g., chip package 100, in accordance with the disclosure may be used for various applications, such as measuring a current. Chip package 100 may be applicable for direct current (DC) or alternating current (AC) applications, e.g., DC-to-AC inverters, DC-to-DC inverters, AC-to-DC inverters. Chip package 100 may be used to measure current in semiconductor devices, e.g., metal-oxide-semiconductor field-effect transistors (MOS-FETs) and insulated-gate bipolar transistors (IGBTs), or larger applications, such as in computer numerical (CNC) of machine tools and band conveyors. Chip package 100 may be used in solar applications, e.g., measuring generated current. In addition, chip package 100 may be used in automotive applications, e.g., for electric power assisted steering (EPS), current measurement in the drive train, as well as in heating, ventilation, and air conditioning (HVAC), applications.

In addition, as a current sensor, chip package 100 may be used in battery management systems. For example, in a vehicle containing one or more batteries or an electric motor, chip package 100 may be used to measure operational current levels (for example, converting the stored energy in the batteries to drive the vehicle) all the way down to a leakage current of the vehicle (for example, when parked).

Figure 5A:
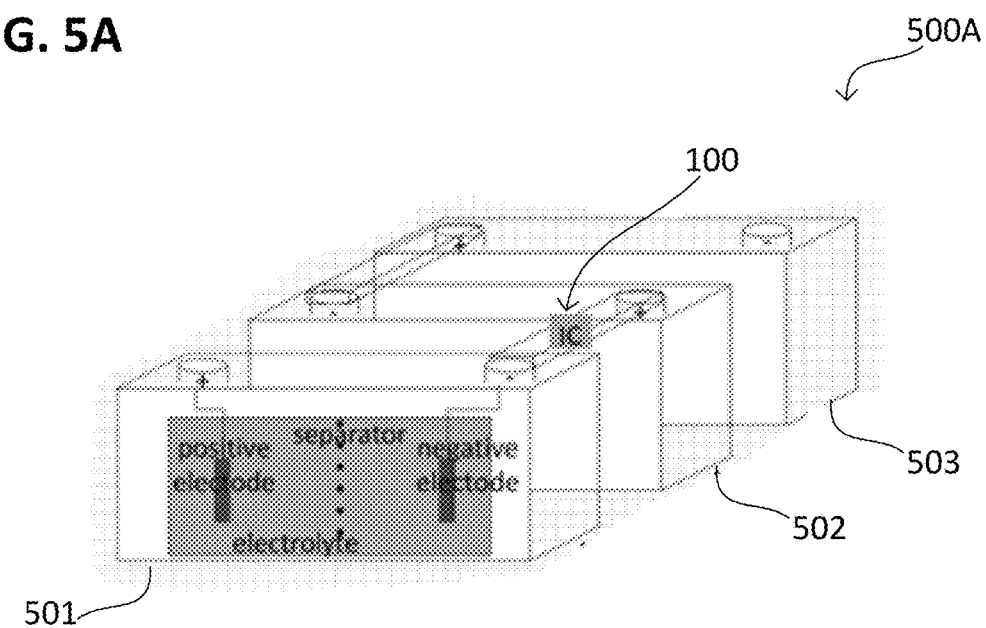
FIGS. 5A & 5B show a chip package with respective battery systems.

Accordingly, as FIG. 5A shows, chip package 100 may be arranged on a battery system 500A, e.g., to measure a target current. Here, battery 501, battery 502, and battery 503 (which may be electrochemical cells, i.e., a battery may convert chemical energy into electrical energy) are connected in series. Although battery system 500A shows three batteries, any number of batteries may be used. Chip package 100 is externally located in relation to the batteries. Chip package 100 may be arranged on an interconnector of battery system 500A, e.g., on a current rail between batteries connected in series. If the batteries are arranged in serial configuration, a current for the entire system may be measured by one chip package 100.

Accordingly, chip package 100 may be arranged outside of a battery cell to measure current in battery system 500A, which may have multiple battery cells, to determine, e.g., a battery charge status of the system.

Figure 5B:
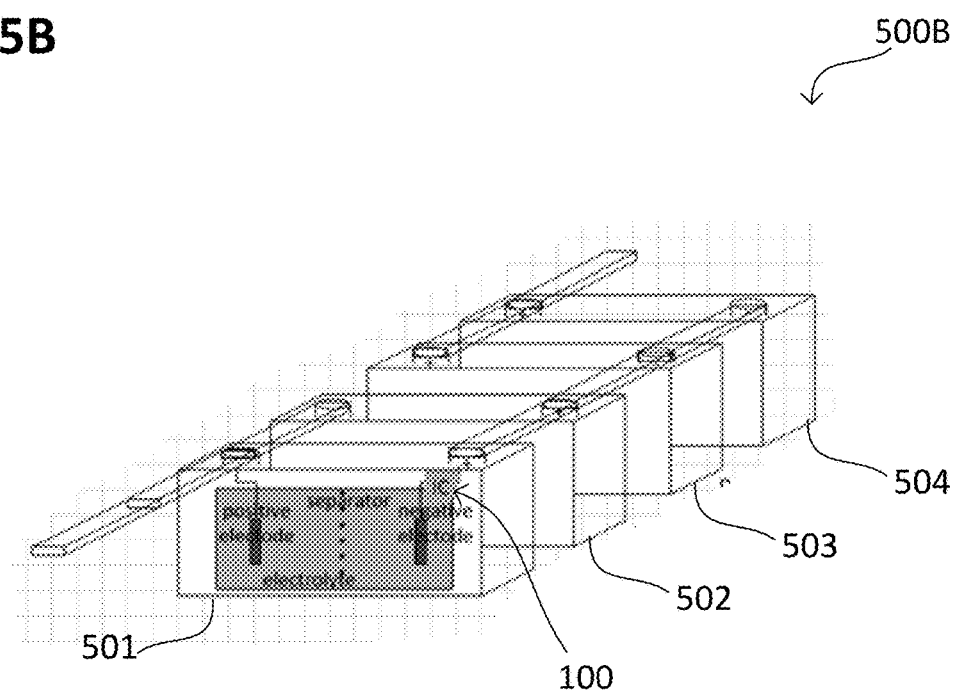

Additionally or alternatively, as shown in FIG. 5B, chip package 100 may be arranged in battery system 500B. Although battery system 500B shows four batteries, any number of batteries may be used. Here, chip package 100 may be internally located, i.e., within a battery cell (e.g., within battery 501, 502, 503). For example, if batteries are arranged in a parallel configuration, the current within each cell may be different. Accordingly, chip package 100 may be internally arranged within a battery cell to measure the current. Likewise, each battery cell may include an internal chip package to measure the current within each battery cell.

Figure 6:
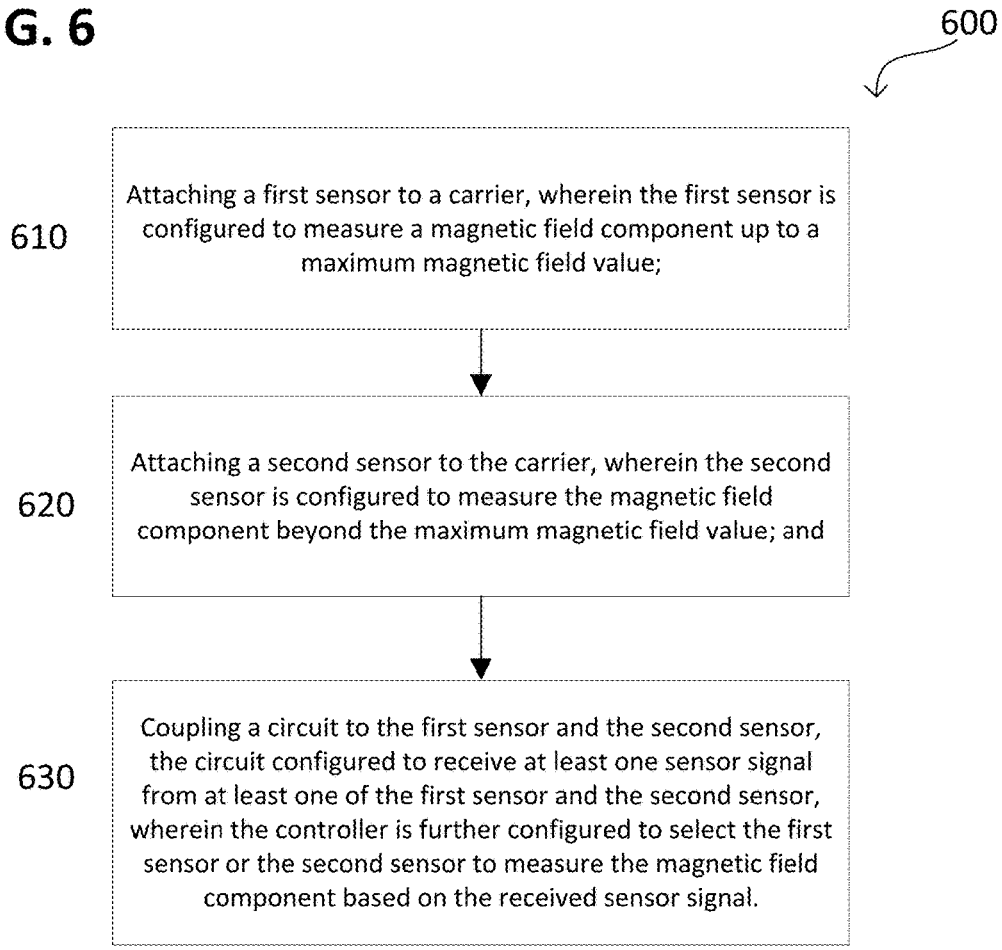
FIG. 6 shows a method of manufacturing a chip package.

FIG. 6 shows a method 600 of manufacturing a chip package, e.g., chip package 100. Method 600 may include: attaching a first sensor to a carrier, wherein the first sensor is configured to measure a magnetic field component up to a maximum magnetic field value 610; attaching a second sensor to the carrier, wherein the second sensor is configured to measure the magnetic field component beyond the maximum magnetic field value 620; and coupling a circuit to the first sensor and the second sensor, the circuit configured to receive at least one sensor signal from at least one of the first sensor and the second sensor, wherein the circuit is further configured to select the first sensor or the second sensor to measure the magnetic field component based on the received sensor signal 630. The chip package manufactured according to the method 600 may further be arranged according to the various aspects of the disclosure discussed above.

Figure 7:
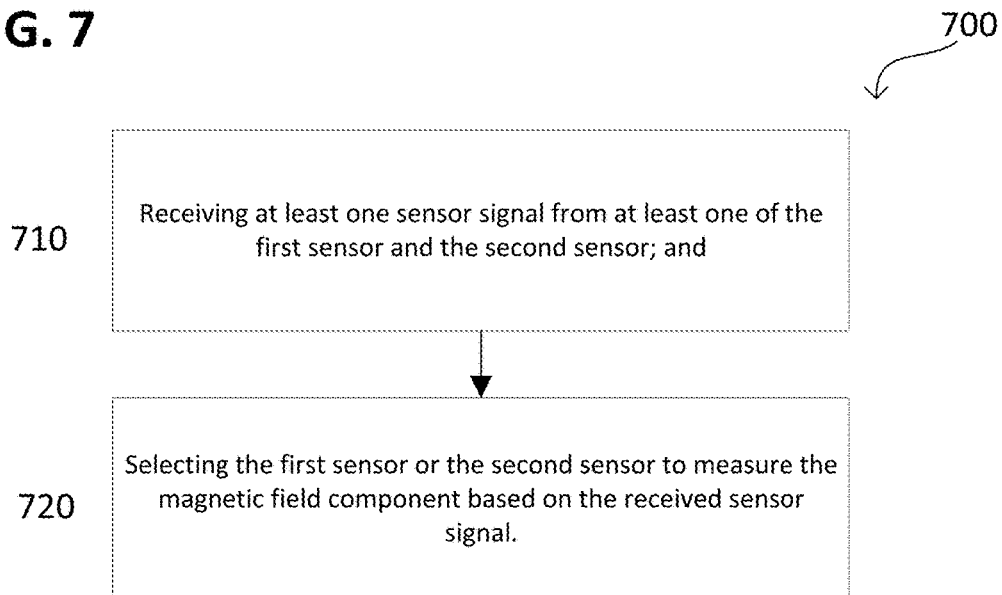
FIG. 7 shows a method of operating a chip package.

FIG. 7 shows a method 700 of operating a first sensor and second sensor of a chip package. The chip package may be similar to chip package 100, and may include a first sensor configured to measure a magnetic field component up to a maximum magnetic field value; a second sensor configured to measure the magnetic field component beyond the maximum magnetic field value. The chip package may be further arranged according to the various aspects of the disclosure discussed above.

Method 700 may include: receiving at least one sensor signal from at least one of a first sensor and a second sensor 710; and selecting the first sensor or the second sensor to measure a magnetic field component based on the received sensor signal 720. Method 700 may be performed by a circuit. Method 700 may be performed by a circuit including a non-transitory computer readable medium.

The first sensor may have a maximum magnetic field value. If the received sensor signal is greater than the maximum magnetic field value, the second sensor may be selected to measure the magnetic field component. If the received sensor signal is less than the maximum magnetic field value, the first sensor may be selected to measure the magnetic field component.

In an Example 1 of an aspect of the disclosure, a chip package may include: a first sensor configured to measure a magnetic field component up to a maximum magnetic field value; a second sensor configured to measure the magnetic field component beyond the maximum magnetic field value; and a circuit coupled to the first sensor and the second sensor and configured to receive at least one sensor signal from at least one of the first sensor and the second sensor, wherein the circuit is further configured to select the first sensor or the second sensor to measure the magnetic field component based on the received sensor signal.

Example 2 may include the chip package of Example 1, wherein the first sensor is configured to provide a first signal corresponding to a magnitude of a magnetic field component in a first value range up to the maximum magnetic field value and the second sensor is configured to provide a second signal corresponding to the magnitude of the magnetic field within a second value range beyond the magnetic field value of the first value range.

Example 3 may include the chip package of Example 2, wherein the first value range and the second value range define a dynamic range.

Example 4 may include the chip package of any one of Examples 2 and 3, wherein the first value range and the second value range at least partially overlap.

Example 5 may include the chip package of any one of Examples 2-4, wherein the first value range and the second value range that at least partially overlap form a common value range.

Example 6 may include the chip package of any one of Examples 2-5, wherein the circuit is further configured to redundantly provide the sensor signal from the first sensor and the second sensor within the common value range.

Example 7 may include the chip package of any one of Examples 1-6, the chip package further including: a carrier, wherein the first sensor, the second sensor, and the circuit are arranged on the carrier.

Example 8 may include the chip package of Example 7, wherein the carrier is non-magnetic.

Example 9 may include the chip package of any one of Examples 7 and 8, wherein the carrier is a lead frame.

Example 10 may include the chip package of Example 9, wherein the lead frame is a non-magnetic metal.

Example 11 may include the chip package of Example 10, wherein the non-magnetic metal or non-magnetic metal-alloy includes at least one metal from a group of metals consisting of: aluminum, copper, lead, nickel, tin, titanium, zinc, gold, silver, or platinum.

Example 12 may include the chip package of any one of Examples 1-11, wherein at least one of the first sensor and the second sensor measures a magnetic field component parallel to the first sensor or the second sensor.

Example 13 may include the chip package of any one of Examples 1-12, wherein at least one of the first sensor and the second sensor measures a magnetic field component perpendicular to the first sensor or the second sensor.

Example 14 may include the chip package of any one of Examples 1-14, the chip package further including an encapsulant.

Example 15 may include the chip package of Example 14, wherein the encapsulant is a mold material Example 16 may include the chip package of Example 15, wherein the mold material includes a resin.

Example 17 may include the chip package of any one of Examples 1-16, further including: a signal terminal including a separate signal output pin for each of the first sensor, second sensor, and the circuit.

Example 18 may include the chip package of any one of Examples 1-17, further including: a power supply terminal including a separate power supply input pin for each of the first sensor, second sensor, and the circuit.

Example 19 may include the chip package of any one of Examples 1-18, wherein the first sensor and the second sensor have different magnetic sensor technologies.

Example 20 may include the chip package of Example 19, wherein the magnetic sensor technologies for the first sensor and the second sensor are selected from the group of magnetic sensor technologies consisting of: a Hall sensor and a magnetoresistive element.

Example 21 may include the chip package of any one of Examples 19 and 20, wherein the first sensor includes a tunneling magnetoresistive element and the second sensor includes an anisotropic magnetoresistive element.

Example 22 may include the chip package of any one of Examples 1-21, wherein the first sensor includes at least two sensor element strips arranged a first distance apart; wherein the second sensor includes at least two sensor element strips arranged a second distance apart; wherein the first distance is greater than the second distance.

Example 23 may include the chip package of any one of Examples 1-22, wherein the first sensor and the second sensor are rotated in relation to one another in a plane.

Example 24 may include the chip package of Example 23, wherein the first sensor and the second sensor are rotated in the x-y plane.

Example 25 may include the chip package of any one of Examples 1-24, further including: a carrier; a first die attached to the carrier, the first die including the first sensor; and a second die attached to the carrier, the second die including the second sensor.

Example 26 may include the chip package of Example 25, further including: an electrically insulating adhesive attaching the first die and the second die to the carrier.

Example 27 may include the chip package of any one of Examples 25 and 26, wherein the first die has a first thickness and the second die has a second thickness, wherein the first thickness is different from the second thickness.

Example 28 may include the chip package of Example 27, wherein the first thickness is greater than the second thickness Example 29 may include the chip package of any one of Examples 1-28, wherein the first die and the second die are arranged on opposite surfaces of the carrier.

Example 30 may include the chip package of any one of Examples 1-28, wherein the first die and the second die are stacked on one another over the carrier.

Example 31 may include the chip package of any one of Examples 1-28, wherein the first die and the second die are arranged next to one another over the same side of the carrier.

Example 32 may include the chip package of any one of Examples 1-31, the chip package further including: an electrically conductive element including electrical contact terminals.

Example 33 may include the chip package of Example 32, wherein the electrically conductive element includes a metal.

Example 34 may include the chip package of any one of Examples 32 and 33, wherein the electrically conductive element is integral with the carrier.

Example 35 may include the chip package of any one of Examples 1-33, wherein the carrier is formed from an electrically conductive material and further includes electrical contact terminals.

Example 36 may include the chip package of Example 35, wherein the electrically conductive material is a metal.

In an Example 37 of an aspect of the disclosure, a chip package system may include: a substrate including an electrically conductive element; and a chip package according to any one of Examples 1-36, wherein the first sensor is arranged a first distance from the electrically conductive element and the second sensor arranged a second distance from the electrically conductive element.

In an Example 38 of an aspect of the disclosure, a method of manufacturing a chip package may include: attaching a first sensor to a carrier, wherein the first sensor is configured to measure a magnetic field component up to a maximum magnetic field value; attaching a second sensor to the carrier, wherein the second sensor is configured to measure the magnetic field component beyond the maximum magnetic field value; and coupling a circuit to the first sensor and the second sensor and configured to receive at least one sensor signal from at least one of the first sensor and the second sensor, wherein the circuit is further configured to select the first sensor or the second sensor to measure the magnetic field component based on the received sensor signal.

Example 39 may include the method of Example 38, wherein the first sensor is configured to provide a first signal corresponding to a magnitude of a magnetic field component in a first value range up to the maximum magnetic field value and the second sensor is configured to provide a second signal corresponding to the magnitude of the magnetic field within a second value range beyond the magnetic field value of the first value range.

Example 40 may include the method of Example 39, wherein the first value range and the second value range define a dynamic range.

Example 41 may include the method of any one of Examples 39 and 40, wherein the first value range and the second value range at least partially overlap.

Example 42 may include the method of Example 41, wherein the first value range and the second value range that at least partially overlap form a common value range.

Example 43 may include the method of Example 42, wherein the circuit is further configured to redundantly provide the sensor signal from the first sensor and the second sensor within the common value range.

Example 44 may include the method of any one of Examples 38-43, wherein the carrier is non-magnetic.

Example 45 may include the method of any one of Examples 38-44, wherein the carrier is a lead frame.

Example 46 may include the method of Example 45, wherein the lead frame is a non-magnetic metal.

Example 47 may include the method of Example 46, wherein the non-magnetic metal or non-magnetic metal-alloy includes at least one metal from a group of metals consisting of: aluminum, copper, lead, nickel, tin, titanium, zinc, gold, silver, or platinum.

Example 48 may include the method of any one of Examples 38-47, wherein at least one of the first sensor and the second sensor measures a magnetic field component parallel to the first sensor or the second sensor.

Example 49 may include the method of any one of Examples 38-48, wherein at least one of the first sensor and the second sensor measures a magnetic field component perpendicular to the first sensor or the second sensor.

Example 50 may include the method of any one of Examples 38-49, further including encapsulating, at least partially, the first sensor, the second sensor, and the circuit.

Example 51 may include the method of Example 50, wherein the encapsulant is a mold material.

Example 52 may include the method of Example 51, wherein the mold material includes a resin.

Example 53 may include the method of any one of Examples 38-52, further including: coupling a signal terminal to each of the first sensor, the second sensor, and the circuit, the signal terminal including a separate signal output pin for each of the first sensor, the second sensor, and the circuit.

Example 54 may include the method of any one of Examples 38-53, further including: coupling a power supply terminal to each of the first sensor, the second sensor, and the circuit, the power supply terminal including a separate power supply input pin for each of the first sensor, the second sensor, and the circuit.

Example 55 may include the method of any one of Examples 38-54, wherein the first sensor and the second sensor have different magnetic sensor technologies.

Example 56 may include the method of Example 55, wherein the magnetic sensor technologies for the first sensor and the second sensor are selected from the group of magnetic sensor technologies consisting of: a Hall sensor and a magnetoresistive element.

Example 57 may include the method of any one of Examples 55 and 56, wherein the first sensor includes a tunneling magnetoresistive element and the second sensor includes an anisotropic magnetoresistive element.

Example 58 may include the method of any one of Examples 38-57, wherein the first sensor includes at least two sensor element strips arranged a first distance apart; wherein the second sensor includes at least two sensor element strips arranged a second distance apart; wherein the first distance is greater than the second distance.

Example 59 may include the method of any one of Examples 38-58, wherein the first sensor and the second sensor are rotated in relation to one another in a plane.

Example 60 may include the method of Example 59, wherein the first sensor and the second sensor are rotated in the x-y plane.

Example 61 may include the method of any one of Examples 38-60, further including: attaching a first die to the carrier, the first die including the first sensor; and attaching a second die to the carrier, the second die including the second sensor.

Example 62 may include the method of Example 61, chip package of Claim 10, further including: attaching the first die and the second die to the carrier via an electrically insulating adhesive.

Example 63 may include the method of any one of Examples 61 and 62, wherein the first die has a first thickness and the second die has a second thickness, wherein the first thickness is different from the second thickness.

Example 64 may include the method of Example 63, wherein the first thickness is greater than the second thickness Example 65 may include the method of any one of Examples 38-64, wherein the first die and the second die are arranged on opposite surfaces of the carrier.

Example 66 may include the method of any one of Examples 38-64, wherein the first die and the second die are stacked on one another over the carrier.

Example 67 may include the method of any one of Examples 38-64, wherein the first die and the second die are arranged next to one another over the same side of the carrier.

Example 68 may include the method of Example 38, further including: forming an electrically conductive element in the chip package, the electrically conductive element including electrical contact terminals.

Example 69 may include the method of Example 68, wherein the electrically conductive element includes a metal.

Example 70 may include the method of any one of Examples 68 and 69, wherein the electrically conductive element is integral with the carrier.

Example 71 may include the method of any one of Examples 38-70, wherein the carrier is formed from an electrically conductive material and further includes electrical contact terminals.

Example 72 may include the method of Example 71, wherein the electrically conductive material is a metal.

In an Example 73 of an aspect of the disclosure, a method of manufacturing a chip package system may include: mounting a chip package manufactured according to any one of the methods of Examples 38-72 to a substrate including an electrically conductive element, wherein the first sensor is arranged a first distance from the electrically conductive element and the second sensor arranged a second distance from the electrically conductive element.

In an Example 74 of a method of operating a first sensor and a second sensor of a chip package, the chip package according to any one of Examples 1-37, the method including: receiving at least one sensor signal from at least one of the first sensor and the second sensor; and selecting the first sensor or the second sensor to measure the magnetic field component based on the received sensor signal.

Example 75 may include the method of Example 74 performed by a circuit.

Example 76 may include the method of Example 75, wherein the circuit further includes memory.

Example 77 may include the method of any one of Examples 74-76, the method performed by a circuit including a non-transitory computer readable medium.

Example 78 may include the method of any one of Examples 74-77, wherein the first sensor may have a maximum magnetic field value.

Example 79 may include the method of Example 78, wherein when the received sensor signal is greater than the maximum magnetic field value, the second sensor may be selected to measure the magnetic field component.

Example 80 may include the method of any one of Examples 78 and 79, wherein when the received sensor signal is less than the maximum magnetic field value, the first sensor may be selected to measure the magnetic field component.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims, and all changes within the meaning and range of equivalency of the claims are therefore intended to be embraced.

What is claimed is:

1. A chip package comprising:
   a first sensor configured to measure a magnetic field component up to a maximum magnetic field value;
   a second sensor configured to measure the magnetic field component beyond the maximum magnetic field value; and
   a circuit coupled to the first sensor and the second sensor and configured to receive at least one sensor signal from at least one of the first sensor and the second sensor,
   wherein the circuit is further configured to select the first sensor or the second sensor to measure the magnetic field component based on the received at least one sensor signal.

2. The chip package of claim 1,
wherein the first sensor and the second sensor have different magnetic sensor technologies.

3. The chip package of claim 2,
wherein the magnetic sensor technologies for the first sensor and the second sensor are selected from the group of magnetic sensor technologies consisting of: a Hall sensor and a magnetoresistive element.

4. The chip package of claim 1,
wherein the first sensor comprises a tunneling magnetoresistive element and the second sensor comprises an anisotropic magnetoresistive element.

5. The chip package of claim 1,
wherein the first sensor comprises at least two sensor element strips arranged a first distance apart;
wherein the second sensor comprises at least two sensor element strips arranged a second distance apart;
wherein the first distance is greater than the second distance.

6. The chip package of claim 1, further comprising:
a carrier;
a first die attached to the carrier, the first die comprising the first sensor; and
a second die attached to the carrier, the second die comprising the second sensor.

7. The chip package of claim 6,
wherein the first die and the second die are arranged on opposite surfaces of the carrier.

8. The chip package of claim 6,
wherein the first die and the second die are stacked on one another over the carrier.

9. The chip package of claim 6,
wherein the first die and the second die are arranged next to one another over the same side of the carrier.

10. The chip package of claim 6,
wherein the carrier is formed from an electrically conductive material; and
wherein the chip package further comprises a plurality of contact terminals electrically connected with the carrier.

11. The chip package of claim 10, further comprising:
an electrically insulating adhesive attaching the first die and the second die to the carrier.

12. The chip package of claim 6,
wherein the carrier is non-magnetic.

13. A chip package comprising:
a first sensor configured to provide a first signal representing a magnitude of a magnetic field within a first value range;
a second sensor configured to provide a second signal representing the magnitude of the magnetic field within a second value range;
wherein the second value range at least partially extends beyond a maximum value of the first value range; and
a circuit coupled to the first sensor and the second sensor and configured to receive the first signal and the second signal,
wherein the circuit is further configured to output at least one of the first signal and the second signal when the magnitude of the magnetic field is within the first value range and to output the second signal when the magnitude of the magnetic field is within the second value range.

14. A chip package system comprising:
a substrate comprising an electrically conductive element;
a chip package attached to the substrate, the chip package comprising:
a first sensor arranged a first distance from the electrically conductive element configured to measure a magnetic field component up to a maximum magnetic field value;
a second sensor arranged a second distance from the electrically conductive element configured to measure the magnetic field component beyond the maximum magnetic field value;
wherein the second distance is greater than the first distance; and
a circuit coupled to the first sensor and the second sensor and configured to receive at least one sensor signal from at least one of the first sensor and the second sensor,
wherein the circuit is further configured to select the first sensor or the second sensor to measure the magnetic field component based on the received sensor signal.

15. The chip package system of claim 14,
wherein the first sensor and the second sensor have different magnetic sensor technologies.

16. The chip package system of claim 15,
wherein the magnetic sensor technologies for the first sensor and the second sensor are selected from the group of magnetic sensor technologies consisting of: a Hall sensor and a magnetoresistive element.

17. The chip package system of claim 14,
wherein the first sensor comprises at least two sensor element strips arranged a first distance apart;
wherein the second sensor comprises at least two sensor element strips arranged a second distance apart;
wherein the first distance is greater than the second distance.

18. The chip package system of claim 14, further comprising:
a carrier;
a first die attached to the carrier, the first die comprising the first sensor; and
a second die attached to the carrier, the second die comprising the second sensor.

19. A method of manufacturing a chip package comprising:
attaching a first sensor to a carrier, wherein the first sensor is configured to measure a magnetic field component up to a maximum magnetic field value;
attaching a second sensor to the carrier, wherein the second sensor is configured to measure the magnetic field component beyond the maximum magnetic field value; and
coupling a circuit to the first sensor and the second sensor and configured to receive at least one sensor signal from at least one of the first sensor and the second sensor, wherein the circuit is further configured to select the first sensor or the second sensor to measure the magnetic field component based on the received sensor signal.

20. A method of operating a first sensor and a second sensor of a chip package, the chip package comprising: a first sensor configured to measure a magnetic field component up to a maximum magnetic field value and a second sensor configured to measure the magnetic field component beyond the maximum magnetic field value, the method comprising:
receiving at least one sensor signal from at least one of the first sensor and the second sensor; and
selecting the first sensor or the second sensor to measure the magnetic field component based on the received sensor signal.

* * * * *